United States Patent
AlRawi

(10) Patent No.: US 9,869,698 B2
(45) Date of Patent: Jan. 16, 2018

(54) OSCILLATOR CIRCUIT WITH RF SUPPRESSION

(75) Inventor: Saieb AlRawi, West Lafayette, IN (US)

(73) Assignee: Landis+Gyr LLC, Lafayette, IN (US)

( * ) Notice: Subject to any disclaimer, the term of this patent is extended or adjusted under 35 U.S.C. 154(b) by 715 days.

(21) Appl. No.: 13/026,195

(22) Filed: Feb. 11, 2011

(65) Prior Publication Data

US 2011/0193569 A1    Aug. 11, 2011

Related U.S. Application Data

(60) Provisional application No. 61/303,537, filed on Feb. 11, 2010.

(51) Int. Cl.
    *H03B 5/30* (2006.01)
    *G01R 27/28* (2006.01)
    (Continued)

(52) U.S. Cl.
    CPC ............ *G01R 11/16* (2013.01); *G01R 22/061* (2013.01); *H03B 5/30* (2013.01); *H03B 5/36* (2013.01);
    (Continued)

(58) Field of Classification Search
    CPC ............ G01R 11/00; H03B 2200/0012; H03B 2200/0088; H03B 2200/009; H03B 2202/00; H03B 2202/04–2202/048; H03B 2202/082–2202/086
    USPC .......... 324/652, 116 R, 142, 103 R, 524, 74, 324/76.11, 110, 113, 140 R, 141; 331/158
    See application file for complete search history.

(56) References Cited

U.S. PATENT DOCUMENTS 2,411,765 A    11/1946    Usselman
2,557,310 A    6/1951    Peterson
(Continued)

FOREIGN PATENT DOCUMENTS

JP    02189957 A  *  7/1990   ............. H01L 23/29
JP    04129303 A  *  4/1992   ............... H03B 5/32
(Continued)

OTHER PUBLICATIONS

How to Choose Ferrite Components for EMI Suppression, by Fair-Rite Products Corp., as captured on Jan. 17, 2009 by archive.org.*

(Continued)

*Primary Examiner* — Kristal Feggins
*Assistant Examiner* — Kendrick Liu
(74) *Attorney, Agent, or Firm* — Maginot, Moore & Beck LLP

(57) ABSTRACT

An oscillator circuit includes a phase-locked loop, a crystal resonator, first and second capacitors, and first and second impedance elements. The phase-locked loop is coupled between a first node and a second node. The crystal resonator is also coupled between the first node and the second node. The first capacitor is coupled between the first node and ground, and the second capacitor is coupled between the second node and ground. The first impedance element is coupled in a first circuit path from the first node to ground through the first capacitor. The second impedance element is coupled in a second circuit path from the second node to ground through the second capacitor.

14 Claims, 3 Drawing Sheets

(51) Int. Cl.
    *G01R 22/06*    (2006.01)
    *G01R 11/16*    (2006.01)
    *H03B 5/36*     (2006.01)

(52) U.S. Cl.
    CPC ...... *G01R 27/28* (2013.01); *H03B 2200/0012* (2013.01)

(56) References Cited

U.S. PATENT DOCUMENTS

| | | | |
|---|---|---|---|
| 2,740,891 A | 4/1956 | Bowser | |
| 4,782,287 A | 11/1988 | Marx | |
| 5,053,726 A * | 10/1991 | Christopher et al. | 331/34 |
| 5,063,359 A | 11/1991 | Leonowich | |
| 5,122,735 A | 6/1992 | Porter | |
| 5,184,064 A | 2/1993 | Vicknair | |
| 5,225,792 A * | 7/1993 | Prakash | 331/158 |
| 5,528,201 A * | 6/1996 | Davis | 331/116 FE |
| 5,566,573 A * | 10/1996 | Yost | 73/643 |
| 5,617,084 A * | 4/1997 | Sears | 340/870.02 |
| 5,844,448 A * | 12/1998 | Jackoski et al. | 331/158 |
| 5,929,715 A | 7/1999 | Nakamiya et al. | |
| 6,147,564 A | 11/2000 | Nakamiya | |
| 6,215,370 B1 * | 4/2001 | Hasegawa et al. | 331/158 |
| 6,313,712 B1 | 11/2001 | Mourant | |
| 6,710,673 B1 * | 3/2004 | Jokerst | 333/12 |
| 6,903,699 B2 * | 6/2005 | Porter et al. | 343/719 |
| 6,927,640 B2 | 8/2005 | Gomez | |
| 7,075,381 B2 | 7/2006 | Hashimoto | |
| 7,227,421 B2 | 6/2007 | Hashimoto | |
| 7,236,062 B2 | 6/2007 | Chien | |
| 7,271,671 B2 * | 9/2007 | Viljanen | 331/158 |
| 7,432,772 B2 | 10/2008 | Mattisson | |
| 7,522,639 B1 * | 4/2009 | Katz | 370/503 |
| 7,560,999 B2 * | 7/2009 | Sato | 331/116 FE |
| 7,639,092 B2 * | 12/2009 | Shen et al. | 331/36 C |
| 7,868,710 B1 * | 1/2011 | Farahvash et al. | 331/179 |
| 2001/0006357 A1 * | 7/2001 | Yamamoto | 331/75 |
| 2003/0036864 A1 * | 2/2003 | Randall | G01R 22/00 702/79 |
| 2004/0201430 A1 | 10/2004 | Mattisson | |
| 2006/0158348 A1 | 7/2006 | Ramirez | |
| 2006/0267702 A1 * | 11/2006 | Neumann | H03L 1/025 331/176 |
| 2007/0257740 A1 | 11/2007 | Boser | |
| 2008/0180183 A1 * | 7/2008 | Kiyohara et al. | 331/116 R |
| 2010/0190435 A1 * | 7/2010 | Cook et al. | 455/41.1 |
| 2011/0009057 A1 * | 1/2011 | Saunamaki | 455/41.1 |

FOREIGN PATENT DOCUMENTS

| | | | | |
|---|---|---|---|---|
| JP | 05129833 A | * | 5/1993 | ............ H03B 1/04 |
| JP | 08162884 A | * | 6/1996 | |
| JP | 2006222675 A | * | 8/2006 | |

OTHER PUBLICATIONS

Application Note 71M652X, Power Meter IC, Design for EMC, Mar. 2009, 1-18, Rev 2.2, Teridian Semiconductor Corp., Irvine, CA.

* cited by examiner

OSCILLATOR CIRCUIT WITH RF SUPPRESSION

This application claims the benefit of U.S. Provisional Patent Application Ser. No. 61/303,537, filed Feb. 11, 2010, which is incorporated herein by reference.

FIELD OF THE INVENTION

The present invention relates generally to oscillator circuits, and more particularly, oscillator circuits that are subject to high frequency signals, such as in an electricity meter.

BACKGROUND OF THE INVENTION

Oscillator clock circuits that utilize a crystal oscillator reference are widely used in electronic devices. One application of crystal oscillator-referenced clock circuits is in metrology circuits, such as in electricity meters.

The primary function of an electricity meter is to accurately measure energy consumption. Oscillator circuits are used in electricity meters to, among other things, provide clock signals for digital processing elements, and to provide real-time clock information for enhanced energy consumption metering modes. An example of an enhanced metering mode that requires real-time clock information is time-of-use metering. Time-of-use metering involves measuring electricity consumption during discrete time periods during a day, week, month and/or year and applying specific rates based on the time period. For example, energy used between 3:00 pm and 4:00 pm in the summer months may be charged at a higher rate than electricity used between 2:00 am and 3:00 am. Accordingly, the real-time clock allows application of the appropriate rate at the time that the energy consumption is measured. Electricity meters have other features, known in the art that also employ a real-time clock.

Features of an electricity meter that rely on a real-time clock usually require a high-accuracy clock. An inaccurate clock can lead to, for example, misapplication of time-specific cost rates, thereby causing billing errors. Clock accuracy is typically ensured by a timing reference that accurately tracks time. In many cases, the timing reference in an electricity meter may be derived from the 60 Hz signal of the mains AC power. One drawback of using mains AC power as a clock reference is the loss of the reference in the event of a power interruption. In particular, if there is a power interruption, the clock loses its AC reference and can fail or drift. Another source of an accurate timing reference is a crystal oscillator circuit. A crystal oscillator circuit having high accuracy may be used as a frequency reference which can provide continued accuracy during power interruption, so long as the meter circuits have power from a back up source such as a battery. Accordingly, many meters employ crystal oscillator circuits as a stable frequency reference.

In addition to metering features that employ a real-time clock, meters have increasingly incorporated automated meter reading ("AMR") technology which includes a communication circuit that allows meter information to be gathered remotely. One of the main AMR technologies incorporates a radio that is connected to the meter. Various implementations of AMR radios employ different power levels and operating frequencies.

Unfortunately, the implementation of AMR radios can lead to the introduction of electromagnetic interference in the meter circuits. Typically, the radio and its antenna are mounted inside the meter in very close proximity to the metrology electronics. Because of the close proximity, the operation of radios can undesirably affect meter performance. In particular, a widely used radios are the 900 MHz unrestricted band (902 MHz to 928 MHz), with Frequency Hopping Spread Spectrum (FHSS). Accordingly, interference often occurs in the form of radiated signals having a frequency in the vicinity of 1 GHz. The problems of RF signal interference has been exacerbated by the more recent use of higher power radios. Specifically, although radios were first introduced at low power ranges (100 mW), it is not uncommon to employ AMR radios at levels of 250 mW, 500 mW, and 1 Watt.

A specific area of concern is the crystal oscillator reference frequency circuit. Electricity meters employ crystal oscillators to provide a stable time base that is important for many purposes, at least some of which would be equally applicable to microprocessor based gas and water meters. Induced RF noise on the crystal oscillator circuit can result in disruptive errors in the clock circuit operation.

More specifically, FIG. 4 discloses an exemplary Pierce oscillator circuit employing a crystal resonator, which may be used in a typical electricity meter. The operating principle of the Pierce oscillator circuit is to generate a stable and accurate frequency for meter operation. In general, the Pierce oscillator (or crystal oscillator) circuit generates a stable and accurate frequency that is used in conjunction with a Phase Locked Loop circuit, not shown, to generate clocking signals for the microprocessor within the processor chip package 12. The only external components for the oscillator circuit are a crystal resonator and two load capacitors C1, C2. It will also be appreciated that the chip package 12 typically incorporates electrostatic discharge Zener diodes 16 for ESD protection.

RF power from a radio installed in the meter housing or external can be picked up by the ground plane due to the relative magnitude of the signals, as well as the size of the plane and traces on the board. The power of the induced RF signal is proportional to the plane and trace sizes (acting as antennas), the transmitted power (higher power, close proximity of the transmitter, or both), and the frequency. At higher frequencies, smaller traces become more effective antennas, per the formula: $\lambda = C/f$, where $\lambda$ is the wavelength, C is the speed of light $3 \times 10^{\wedge}8$ meters per second, and f is the operating frequency.

The ESD diode 16 is typically built into processing chips at input and output pins, and is referenced to the ground, supply voltage rail, or both. Such ESD diodes can rectify the induced RF signals and convert them to DC voltages, which can in turn alter the bias voltage at the respective input and output pins, or even causing current to flow. The DC voltage created by the rectified RF signals can cause errors in the internal clock circuits due to the topology of the clock circuits. In some cases, the errors can cause the clock circuit to fail to generate any stable frequency, resulting in a completely inoperative clock. As is well known, an inoperative clock can result in overall device malfunction.

Even with minor disturbances, the induced RF noise, depending on its severity can alter the amplitude as well as the phase of the oscillator which in turn will influence the microprocessor operation in undesirable manner.

In particular, the RF noise can couple to the oscillator circuit either through the crystal oscillator load capacitors (22, and 27 pF) as they provide relatively low impedance path:

$$Xc = 1/[(2 \times \mu \times f(915 \text{ MHz}) \times C(22 \text{ pF})] = 8 \text{ } \Omega$$

or directly to the traces between the external crystal oscillator circuit and the microprocessor.

In the art, it has been suggested to connect a ferrite bead between ground and a node, and connecting the capacitors to each other at that node. This is disclosed in Teridian EMC design application note; AN_6552_041_v2-2 EMC Design.

However, this topology has been found to provide insufficient noise suppression in metering applications.

SUMMARY

At least some embodiments of the present invention reduce noise by introducing high impedance to circuit paths that can form high frequency loops within an oscillator circuit. For example, embodiments of the invention use impedances that are directly in the circuit loop that includes load capacitors of the reference frequency oscillator circuit.

A first embodiment is an oscillator circuit that includes a phase-locked loop, a crystal resonator, first and second capacitors, and first and second impedance elements. The phase-locked loop is coupled between a first node and a second node. The crystal resonator is also coupled between the first node and the second node. The first capacitor is coupled between the first node and ground, and the second capacitor is coupled between the second node and ground. The first impedance element is coupled in a first circuit path from the first node to ground through the first capacitor. The second impedance element is coupled in a second circuit path from the second node to ground through the second capacitor.

A second embodiment is an arrangement for use in an electricity meter that includes a metrology circuit, an RF communication transmission device, and an oscillator circuit. The metrology circuit is operably coupled to detect and measure electrical signals provided to a load. The metrology circuit includes a processing unit that is configured to generate metering information based on the measured electrical signals. The RF communication transmission device is configured to transmit metering information to a remote location. The oscillator circuit includes a crystal resonator between a first node and a second node, and a further element coupled between the first node and the second node. The oscillator circuit further includes a first capacitor coupled between the first node and ground, and a second capacitor coupled between the second node and ground. The oscillator circuit also includes a first impedance element in a first circuit path from the first node to ground through the first capacitor. The first impedance element is disposed such that each circuit path from the first node to the second node through the first capacitor includes the first impedance element. The first impedance element is configured to attenuate RF signals transmitted by the RF communication device that are coupled into at least portions of the oscillator circuit.

The above-described features and advantages, as well as others, will become more readily apparent to those of ordinary skill in the art by reference to the following detailed description and accompanying drawings.

DETAILED DESCRIPTION

Figure 1:
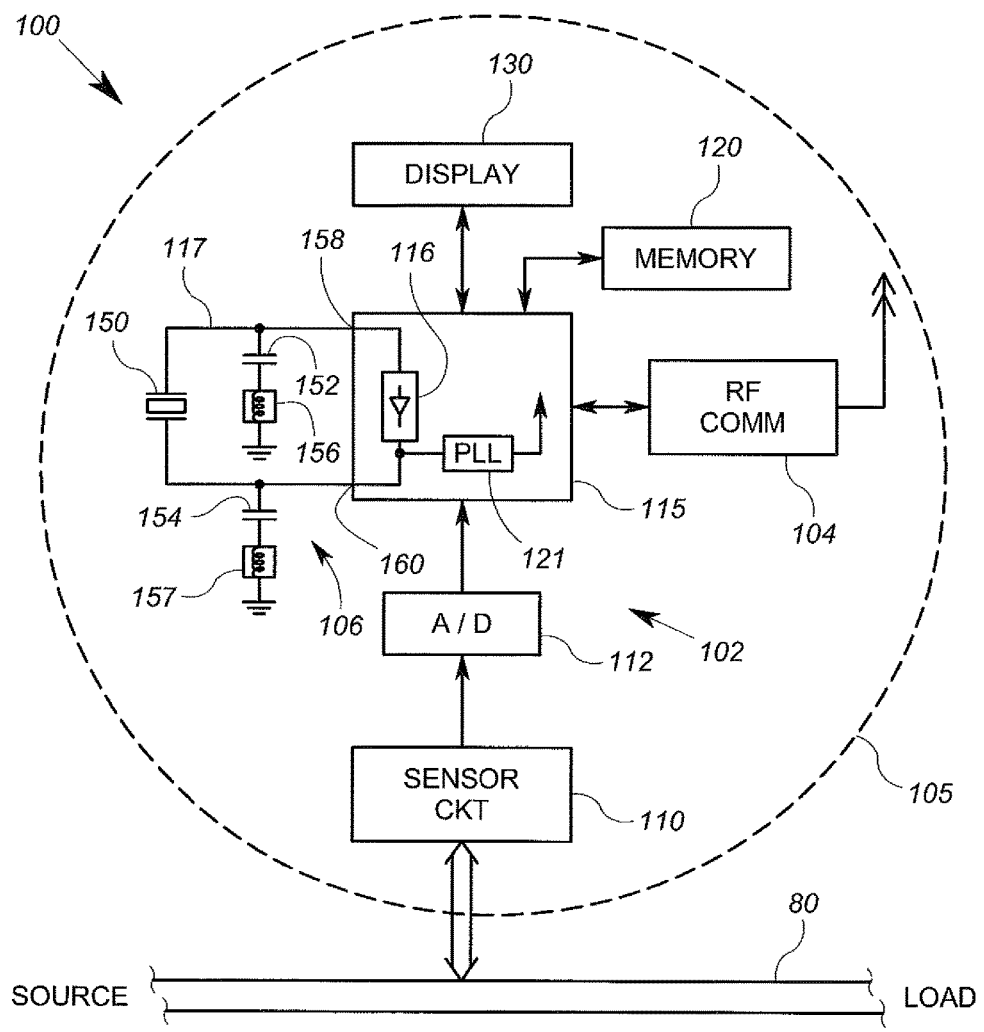
FIG. 1 shows an exemplary metering arrangement that incorporates an embodiment of the invention.

FIG. 1 shows an exemplary meter 100 according to a first embodiment of the invention. The meter 100 includes a housing 105 in which are disposed a metrology circuit 102, an RF communication circuit 104 and oscillator circuit 106. The metrology circuit 102 further includes a sensor circuit 110, an A/D conversion unit 112, at least a portion of a processing circuit 115, and a phase locked loop circuit 121. The oscillator circuit 106 includes elements both external to and internal to the processing circuit 115. Specifically, the oscillator circuit 106 includes internal oscillator components 116 and external oscillator components 117.

It will be appreciated that in the exemplary embodiment, the processing circuit 115 is a commercially available chip package that includes the internal components 116, and which is intended to be connected to an external source of a clock reference frequency. The internal oscillator components 116 cooperate with the external components 117 to generate a stable reference frequency for phase locked loop 121, which in turn generates the clock information used by the digital processing elements of the processing circuit 115. The processing circuit 115 may also use the clock information to maintain a real-time clock.

The external oscillator components 117 of the oscillator circuit 106 include a resonator, for example, a crystal resonator 150, and load capacitors 152, 154 of a Pierce oscillator circuit. Such elements are known. In accordance with at least some embodiments of the present invention, the external elements of the oscillator circuit 106 further include impedance elements 156, 157.

The crystal resonator 150 is coupled between a first node 158 and a second node 160. The crystal resonator 150 may suitably be a commercially available device that can be configured to generate a consistent reference frequency signal. Such devices are known in the art.

The first node 158 and second node 160 may suitably be terminals of the chip package of the processing circuit 115. Accordingly, the internal oscillator components 116 are operably coupled between the first node 158 and the second node 160. As discussed above, the internal oscillator components 116 include one or more elements of a Pierce oscillator, such as the inverter/amplifier, not shown, and a resistance coupled across the inverter amplifier, not shown. Further details regarding exemplary configurations of elements that may comprise the internal oscillator components 116 are provided below in connection with FIGS. 2 and 3.

The first load capacitor 152 is coupled between the first node 158 and ground, and the second load capacitor 154 is coupled between the second node 160 and ground. The first and second capacitors 152 and 154 are used to trim the frequency of the crystal resonator 150. In particular, impedance characteristics of the internal oscillator components 116 can influence the resonant frequency of the crystal resonator 150. As is known in the art, the capacitors 152 and 154 are chosen to match with the crystal resonator frequency.

Each of the impedance elements 156, 157 is configured to attenuate signals including at least those in the frequency range of the signals transmitted by the RF communication circuit 104. The impedance element 156 is coupled in a first circuit path from the first node 158 to ground through the first capacitor 152. The impedance element 157 is coupled in a second circuit path from the second node 160 to ground through the second capacitor 154. Accordingly, the impedance elements 156, 157 avoid the creation of a low impedance, high frequency path through ground between the first and second nodes 158, 160. In embodiments described herein, the impedance elements 156, 157 may be ferrite beads or resistors. If resistors are selected, they should be chosen to have a resistance at least about two orders of magnitude below the impedance of the load capacitors 152, 154 at the frequency of the crystal resonator 150. At such a level the resistors (impedance elements 156, 157) represent a relatively low impedance to the signals generate by the crystal resonator 150, but a relatively high impedance to high frequency signals such as those generated by the RF transmitter 104 of the meter 100.

As discussed further above, the ground plane traces can act as antennas that receive the RF signals generated by the RF communication circuit 104. Because the capacitors 152, 154 act like short circuits to high frequency signals, the received RF signals would normally be able to travel directly to the internal oscillator components 116 via the ground plane. However, the impedance elements 156, 157 attenuate these signals before they can propagate to the internal oscillator components 116.

It will be appreciated that each of the impedance elements 156, 157 is also coupled in any path between the first and second nodes 158 and 160 that includes either of the capacitors 152, 154. This avoids the existence of a low impedance, high frequency path from the first node 158 to the second node 160, even those paths that do not involve ground. Specifically, even if a high impedance is used to isolate ground from the first and second nodes 158 and 160, a low impedance path could exist from the first node 158 to the second node 160 through the capacitors 152, 154. In this embodiment, the impedance elements 157, 158 provide relatively high impedance in circuit paths in which the load capacitors 152, 154 might otherwise provide a low impedance path between the first and second node 158, 160, specifically at high frequencies.

Referring now to the housing 105, the housing 105 may take any suitable form, and is generally configured to withstand a wide range of environmental conditions. The housing 105 also provides at least some protection against environmental conditions to the various elements disposed therein. Suitable housings for utility meters are well-known in the art.

As discussed above, the metrology circuit 102 includes the sensor circuit 110, as well as an A/D conversion unit 112 and the processing circuit 115. The sensor circuit 110 in one embodiment includes voltage sensors and current sensors that are operably coupled to detect voltage and current signals representative of voltage and current provided to a load, and generate measurement signals therefrom. In particular, the measurement signals generated by the sensor circuit 110 are analog signals each having a waveform representative of the voltage and current provided to the load. A suitable example of a voltage sensor includes a voltage divider that is operably coupled to the power lines. A suitable example of a current sensor includes a current transformer that is disposed in a current sensing relationship with the power line signal. These and other voltage and current sensors are known in the art.

The A/D conversion unit 112 may be any suitable analog-to-digital converter that is configured to sample the analog measurement signals generated by the sensor circuit 110. The A/D conversion unit 112 is operably coupled to provide the resulting digital measurement signals to the processing circuit 115.

The processing circuit 115 is a circuit that is configured to receive the digital measurement signals from the A/D conversion unit 112 and generate energy consumption data therefrom. According to an exemplary embodiment, the processing circuit 115 includes digital processing circuitry that processes the digitized measurement signals to thereby generate the energy consumption data. Such circuits are well known in the art. As is known in the art, the processing circuit 115 may include a controller and/or digital signal processor.

Accordingly, the sensor circuit 110, the A/D conversion unit 112 and processing circuit 115 form the metrology circuit 102, which is configured to generate energy consumption data representative of energy used by the load. The processing circuit 115 in some embodiments also performs one or more operations that rely on a real-time calendar/clock.

The memory 120 includes one or more storage devices of different types. The memory 120 may include volatile or non-volatile RAM, EEPROM, or other readable and writeable memory device. The memory 120 stores instructions and/or parameters used by the processing circuit 115, and may further store energy consumption data.

The RF communication circuit 104 is operably coupled to the processing circuit 115, and is also operable to communicate with a remote device. The communication circuit 104 transmits signals representative of energy consumption data, and/or other data, to a remote device via wireless network, not shown, but which is known in the art. The communication circuit 104 is also used to allow external devices to interrogate the meter for detailed data and to control some of its functions (example; open/close the service disconnect switch). The communication circuit 104 may also include an interface to an optical communication port, not shown. The optical communication port would provide direct access to the meter (password protected) to read, interrogate, or reprogram/reconfigure the meter using metrology specific software.

The display 130 is operably coupled to the processing unit 115 and provides a visual display of information, such as information regarding the operation of the meter 100. For example, the display 130 may provide a visual display regarding the power measurement operations of the meter 100.

During normal operation, however, the metrology circuit 102 performs operations to detect electrical signals (proportional to load consumption) on the power lines 80 and generating metering information therefrom. Such operations are known in the art. The processing circuit 115 further uses precise clock and timing signals generated by the internal oscillator components circuit 116 and the external oscillator components 117 to generate the metering information. In this embodiment, the external oscillator components 117 and the oscillator components 116 of the oscillator circuit 106 cooperate to generate a precision reference frequency for the phase-locked loop clock circuit 121. The phase-locked loop circuit 121 generates high frequency clocking signals for the processing circuit 115. The clocking signals are used to maintain a real-time calendar clock, as well as to generate clock signals for most if not all of the various processing and metrology operations.

From time to time, the RF communication circuit 104 will transmit data to a remote location via RF signals. The data may suitably be metering data. For example, the RF communication circuit 104 may transmit the energy consumption information obtained by the metrology circuit 102 to a service provider data repository, not shown. The service provider may use such information to generate billing information and for other purposes such as load prediction.

The exemplary RF communication circuit 104 transmits RF signals in the vicinity of 1 GHz, and approximated in the 900 MHz range. The signals are often at power levels of 250 mW to 1 W. Such radiated RF signals can be coupled into the ground plane of the device, which includes traces or other conductors that can act as reception antennas for the RF signals. The resulting EMI signals have a similar frequency range as the transmitted RF signals. The impedance elements 156, 157, however, attenuate signals in the frequency range of the RF signals, thereby substantially reducing the amplitude of the EMI signals on the ground plane that would otherwise propagate through the first capacitor 152 and second capacitor 154. In addition, any other traces or wires that within the circuit paths between the first node 158 and second node 160 are also attenuated by the impedance element 156, 157.

Figure 2:
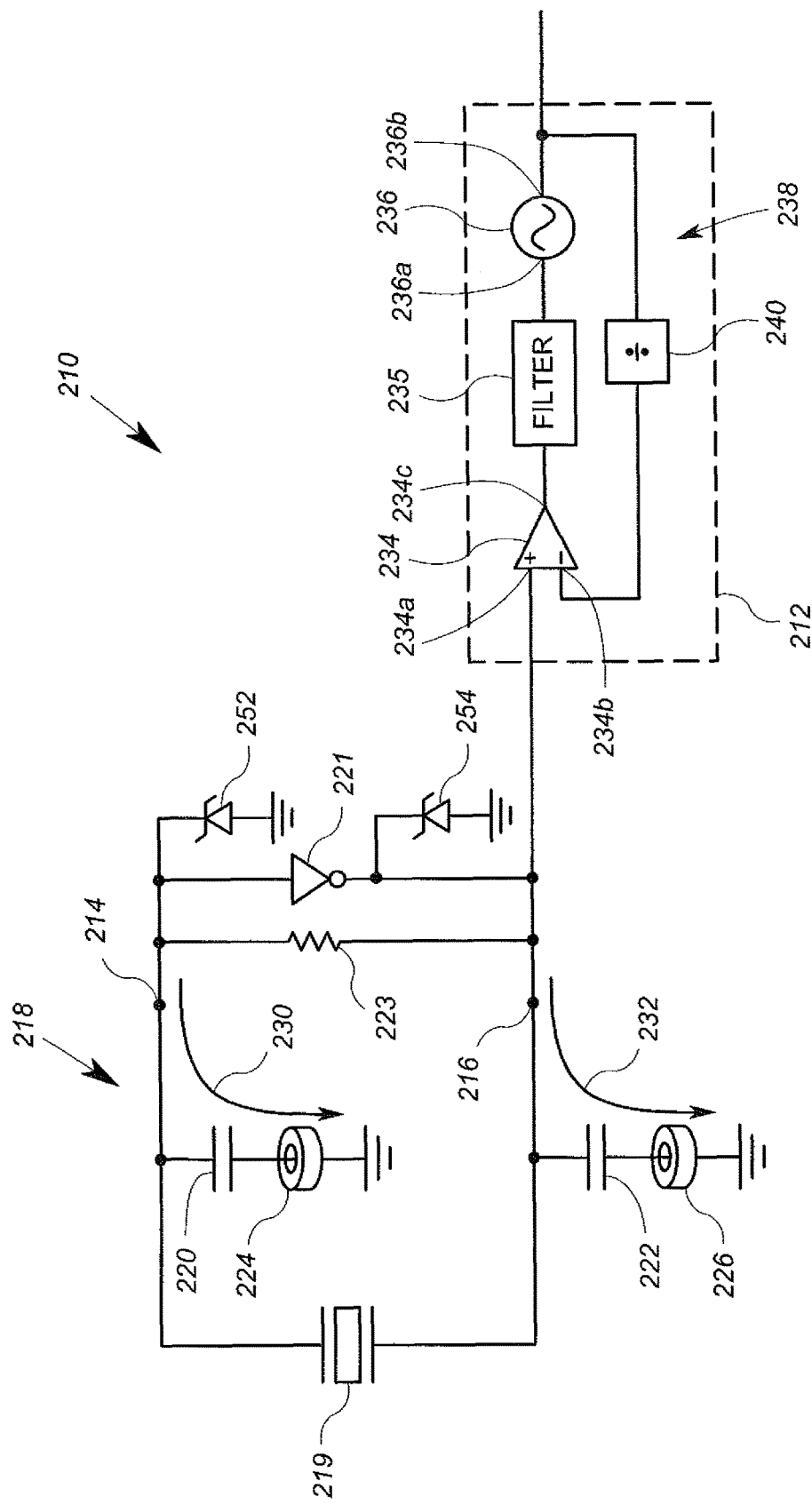
FIG. 2 shows an exemplary oscillator circuit according to an embodiment of the invention.
Figure 3:
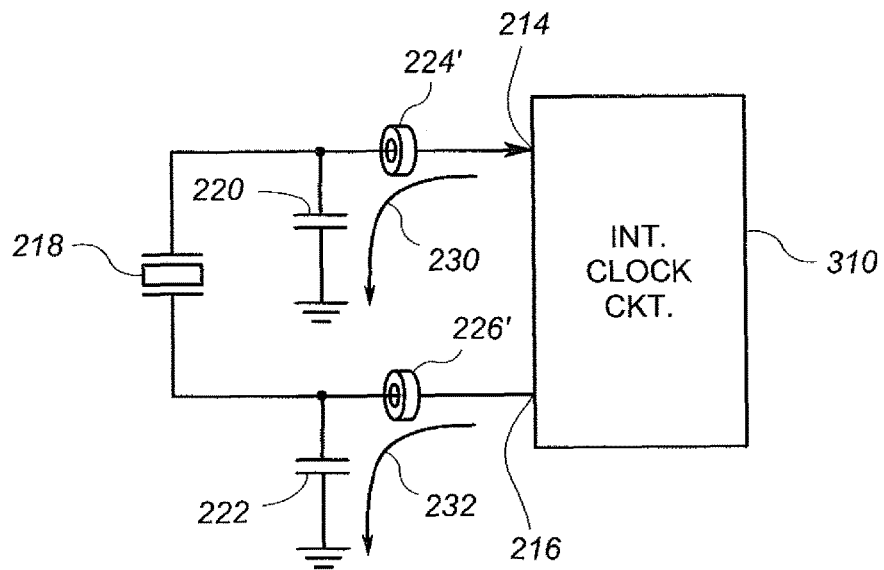
FIG. 3 shows another exemplary oscillator circuit according to an embodiment of the invention.
Figure 4:
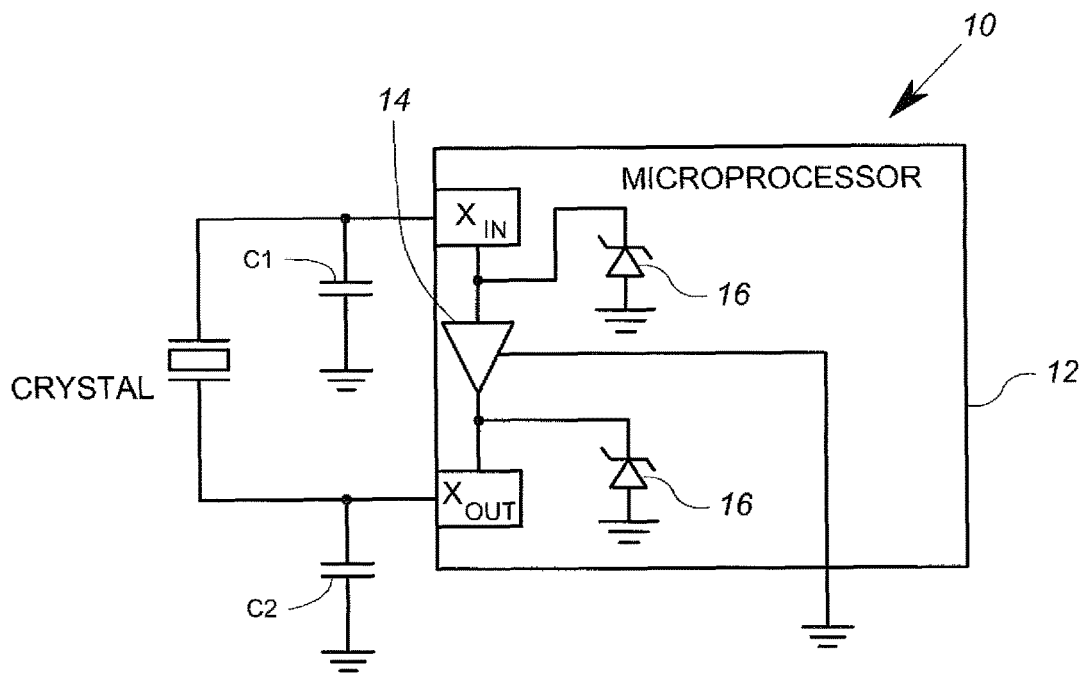
FIG. 4 shows a prior art arrangement of an oscillator circuit.

The above-described embodiment reduces the influence of EMI signals from a meter's RF transmission on the meter's clock circuit. FIGS. 2 and 3 show in further detail the specifics of oscillator circuits that may be implemented in the embodiment of FIG. 1, or may be used in other devices and circuits wherein high frequency EMI signals can propagate onto a ground plane of the oscillator circuit.

FIG. 2 shows an exemplary oscillator circuit 210 according to an embodiment according to the invention. The oscillator circuit 210 includes phase-locked loop 212 and a crystal oscillator circuit 218. The crystal oscillator circuit 218 includes a crystal resonator 219, a first capacitor 220, a second capacitor 222, a unity gain amplifier 221, a resistor 223, a first ferrite bead 224 and a second ferrite bead 226. The oscillator circuit 210 also includes ESD protection diodes 252, 254. In general, the PLL 212 corresponds to the PLL 121 of FIG. 1. Analogously, the unity gain amplifier 221 and resistor 223 correspond to the internal components 116 of the Pierce oscillator of FIG. 1. Similarly, the crystal resonator 219, the first capacitor 220 and the second capacitor 222 correspond to the external oscillator components 117 of FIG. 1.

Referring specifically to FIG. 2, the unity gain amplifier 221 and a resistor 223 are coupled in parallel between a first node 214 and a second node 216. The phase-locked loop 212 is coupled to the second node 216. The crystal resonator 219 is also coupled between the first node 214 and the second node 216. The first capacitor 220 is coupled between the first node 214 and ground, and the second capacitor 222 is coupled between the second node 216 and ground.

The first ferrite bead 224 is coupled in a first circuit path 230 from the first node 214 to ground through the first capacitor 220. The first circuit path 230 is defined as a circuit path through which current flowing through the first capacitor 220 and ground must necessarily flow. It will be appreciated that "ground" as used herein refers to circuit ground. However, in some embodiments "ground" may be replaced by another reference voltage. Similar to the first ferrite bead 224, the second ferrite bead 226 is coupled in a second circuit path 232 from the second node 216 to ground through the second capacitor 222.

Ferrite beads are generally configured to suppress undesirable noise in electronics and electrical circuits by absorbing the noise power and converting it to heat instead of re-radiating it. Ferrite beads also have very low impedance at DC and low frequencies, and very high impedance at higher frequencies depending on the application they are designed for.

The phase-locked loop 212 is a circuit that uses feedback and error-correction to lock onto a desired frequency. By way of a generalized example, the phase-locked loop 212 in FIG. 2 includes a comparator 234, a filter 235, a voltage controlled oscillator 236, and a feedback path 238 that includes a dividing unit 240. The comparator 234 includes differential inputs 234a, 234b that connect, respectively, to the second node 216 and the feedback path 238. The voltage-controlled oscillator (VCO) 236 includes an input 236a coupled to the output 234c of the comparator 234 via the filter 235. The output 236b forms the output of the phase-locked loop 212 and the oscillator circuit 210, and is coupled to the dividing unit 240. The feedback path 238 extends from the second node 216 (or output 236b) through the dividing unit 240 to the differential input 234b of the comparator 234.

In general, the phase-locked loop 212 locks onto a reference frequency provided at the second node 216 by the Pierce oscillator circuit formed in part by the crystal resonator 219, the amplifier 221 and the resistor 223. The VCO 236 of the phase-locked loop 212 generates an output frequency at its output 236b that is provided to other circuits, not shown, as a clock reference. The dividing unit 240 also receives the output oscillating signal and performs frequency division such that the frequency of the signal provided to the input 234b corresponds to the frequency of the crystal resonator 219.

To generate the reference frequency, the crystal oscillator circuit 218, balanced by the load capacitors 220, 222, resonates at its fixed frequency. The crystal resonator 219 maintains the precision of the Pierce oscillator reference frequency provided to the PLL 212 through node 216, and thus the input 234a of the comparator circuit 234.

The comparator circuit 234, which may suitably be a differential amplifier circuit, compares the signals provided at the input 234b from the divider 240 to the reference at 234a. Ideally, the divided clock output signal at the input 234b will equal the output of the crystal oscillator circuit 218 at the input 234a. However, to the extent that there is a drift in frequency at the clock output, the comparator circuit 234 generates an error signal at its output 234c representative of the phase difference between the inputs 234a, 234b, which in turn is representative of the error in the output frequency of the circuit 210.

The error signal generated at the output 234c of the comparator 234a in the form of DC voltage is used as an input to the VCO circuit 236 to retune its frequency output. The filter 235 is used to filter the error signal to drive the VCO. In addition, the error signal may be provided with appropriate bias levels for the base frequency of the VCO circuit 236. It will be appreciated that the implementation of the PLL 212 may take many forms as is known in the art. The inventive aspects disclosed herein are applicable in many or all of such implementations.

The unity gain amplifier 221 provides 180 degrees phase shift while the capacitors 220 and 222 serve to provide the other 180 degree phase shift to the input of the amplifier 221 in order to maintain the oscillation at the desired frequency. Their values are also employed to fine tune the frequency crystal oscillator 218. Specifically, the parasitic capacitance of elements of the PLL 212 can affect the output frequency of the crystal oscillator circuit 218. It is known in the art to provide load capacitors to adjust the frequency of the crystal oscillator circuit 218 to compensate for any such sources of inaccuracy in the frequency. Accordingly, the frequency of the signal provided at nodes 214 and 216 are adjusted by the load capacitors 220, 222.

From time to time, relatively strong RF signals 260 from another source, such as a radio, not shown, may radiate in vicinity of the oscillator circuit 210. Due to traces formed by the ground plane as well as other elements of the other circuits, not shown, the RF signals 260 have a tendency to couple throughout the circuit 210. For example, during normal operation, both inputs 234a, 234b to the comparator 234 are DC biased where the input frequencies (AC signals) are superimposed to represent the positive and negative parts of the signals. When strong RF signals are picked up by the circuit following the loop from ground plan through the ESD diode 254 through capacitor 222 (low impedance at RF) then back to the ground (the source), then ESD diode 254 could, in the absence of the inventive arrangement, rectify the RF into DC shifting the bias voltage on the input 234a, thereby potentially causing the loss of part or all the positive or negative cycles, which is undesirable and can interfere with normal meter operation.

However, according to this embodiment of the invention, the ferrite beads 224, and 226 (or resistors) located within the RF loop attenuate the interfering signal and prevent its influence on the oscillator circuit. Specifically, the ferrite beads 224 and 226 absorb the energy from high frequency signals, for example, those on the order of 1 GHz, and convert the energy into heat energy. By this action, the ferrite beads 224, 226 remove the high frequency RF signals imposed on the circuit 210 while allowing the relatively low frequency signals of the oscillator circuit 210 relatively unchanged. This embodiment exploits the selectivity of the ferrite bead to high frequencies that are essentially out of the frequency range of interest in the oscillator circuit 210, but which are radiated from a closely located RF device such as a radio.

The above described embodiment further takes advantage of the fact that the circuit path most susceptible to problems due to radiating RF includes the ground plane, the capacitors 220, 222, and the PLL 212. In this circuit path, the capacitors 220, 222 operate like short circuits to high frequency signals, thereby passing signals radiated onto the ground plane to the devices of the PLL 212. By placing the ferrite beads 224, 226 into the circuit path, the high frequency signals are absorbed.

It will be appreciated that alternative embodiments take advantage of this technique. For example, FIG. 3 shows a first alternative embodiment of an oscillator circuit 210' wherein ferrite beads 224' and 226' are connected in a different position, but still along circuit paths 230 and 232. Common elements of the oscillator circuit 210 of FIG. 2 and the oscillator circuit 210' of FIG. 3 are denoted by common reference numbers. Elements 212, 221, and 223 are merely denoted as internal clock circuit 310.

As shown in FIG. 3, the ferrite bead 224' is coupled between the first node 214 and a common node of the crystal resonator 219 and the capacitor 220, and the ferrite bead 226' in FIG. 3 is coupled between the second node 216 and a common node of the crystal resonator 219 and the capacitor 222.

The operation of the circuit 210' in FIG. 3 is similar to the operation of the circuit 210 of FIG. 2. Because the ferrite beads 224' and 226' remain within the circuit paths 230 and 232, the ferrite beads remain within the circuit loop formed by the capacitors 220, 222, the internal clock circuit 310, and ground. Accordingly, the RF signals that would otherwise radiate onto that circuit loop are absorbed by the ferrite beads 224' and 226'. The ferrite beads 224' and 226' convert the signal energy to heat energy. Because of the frequency response of the ferrite beads 224' and 226', the desired signals of the oscillating circuit 210 remain relatively unaffected.

It will be appreciated that the above embodiments can have application in devices that use other types of high precision oscillator circuits. In particular, any circuit that uses a crystal resonator, such as the crystal oscillator circuit 218, with load capacitors similar to capacitors 220 and 222, and one or more amplification elements between the first node 214 and the second node 216 will benefit from the high frequency absorption operation of the ferrite beads 224, 226 and/or 224', 226'.

As discussed further above, at least some of the advantages of the above-described embodiments may be obtained if the ferrite beads 224, 226 are replaced by resistors. Resistors provide impedances having a relatively flat response curve. Thus, while the capacitors 220, 222 may pass high frequencies from a radio transmitter along the circuit paths 230, 232, resistors would attenuate such frequencies. It will be appreciated, however, that resistors would also attenuate the desirable clock signals within the circuit 210. Nevertheless, the resistors may be chosen to maintain the minimum required current (with relative margin) to keep the reference oscillator circuit operative.

In one example, the crystal resonator 219 has a nominal frequency of 32 kHz, and the load capacitors 220, 222 are in the range of 22 pF. In such a case, the nominal impedance of the capacitors is 220 kΩ. If resistors are used in place of the ferrite beads 224, 226, the resistance of each should preferably be less than two orders of magnitude below the impedance of the capacitors 220, 222 at the oscillator frequency. In this example, the resistors may be 1 kΩ each.

It will be appreciated that the above-described embodiments are merely exemplary, and that those of ordinary skill in the art may readily devise their own implementations that incorporate the principles of the present invention and fall within the spirit and scope thereof. For example, the principles of the invention may be readily incorporated into a meter that does not include an RF communication circuit in order to protect the meter circuit from problems caused by externally-generated RF signals. The principles of the invention may be incorporated into any meter that employs an oscillator circuit.

I claim:

1. An arrangement for use in an electricity meter comprising:
   a metrology circuit operably coupled to detect and measure electrical signals provided to a load, the metrology circuit including a processing unit configured to generate metering information based on the measured electrical signals, the processing unit using clocking signals to maintain a real-time clock and to generate clock signals for metrology circuit operations;
   a phase-locked loop circuit configured to provide the clocking signals to the metrology circuit processing unit, the phase-locked loop circuit having a reference frequency input;
   an oscillator circuit including a crystal resonator coupled between a first node and a second node, and a further element coupled between the first node and the second node, a first capacitor coupled between the first node and ground, and a first impedance element in a first circuit path from the first node to ground through the first capacitor; and
   wherein each circuit path through the first node, the first capacitor and the second node passes through the first impedance element, wherein the first impedance element is configured to attenuate RF signals that are radiated onto at least portions of the oscillator circuit; and wherein the second node is electrically directly coupled to the reference frequency input of the phase-locked loop.

2. The arrangement of claim 1, wherein the first impedance element comprises a ferrite bead.

3. The arrangement of claim 1, wherein the further element comprises an amplifier.

4. The arrangement of claim 1, wherein the oscillator circuit further includes a second impedance element in a second circuit path from the second node to ground through a second capacitor.

5. The arrangement of claim 4, wherein the first impedance element and the second impedance element are substantially identical.

6. The arrangement of claim 4, wherein the first impedance element and the second impedance element comprise ferrite beads.

7. The arrangement of claim 6, further comprising an RF communication transmission device configured to transmit metering information to a remote location, the radiated RF signals originating from the RF communication transmission device.

8. The arrangement of claim 7, further comprising a first rectifying element coupled between the first node and ground, and a second rectifying element coupled between the second node and ground, and wherein each circuit loop through the first rectifying element and one of the first capacitor and the second capacitor includes at least one of the ferrite beads.

9. The arrangement of claim 8, wherein a serial circuit path from the first node to ground through the first rectifying element does not include any ferrite beads.

10. The arrangement of claim 9, wherein every serial circuit path starting at the first node, ending at the second node, and including the first capacitor intermediate thereof, passes through the first impedance element.

11. The arrangement of claim 6, further comprising a first rectifying element coupled between the first node and ground, and a second rectifying element coupled between the second node and ground, and wherein each circuit loop through the first rectifying element and one of the first capacitor and the second capacitor includes at least one of the ferrite beads.

12. The arrangement of claim 11, wherein the crystal resonator is directly electrically coupled between the first node and the second node.

13. The arrangement of claim 12, wherein a serial circuit path from the first node to ground through the first rectifying element does not include any ferrite beads.

14. The arrangement of claim 1, wherein every serial circuit path starting at the first node, ending at the second node, and including the first capacitor intermediate thereof, passes through the first impedance element.

* * * * *